(12) United States Patent
Lee et al.

(10) Patent No.: US 10,971,572 B2
(45) Date of Patent: Apr. 6, 2021

(54) FLEXIBLE OLED PANEL FOR LIGHTING DEVICE AND METHOD OF MANUFACTURING SAME

(71) Applicant: LG Display Co., Ltd., Seoul (KR)

(72) Inventors: Kyu-Hwang Lee, Seoul (KR); Taejoon Song, Paju-si (KR); Chulho Kim, Incheon (KR); Jungeun Lee, Seoul (KR); Shin-Bok Lee, Seoul (KR); Taeok Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/209,055

(22) Filed: Dec. 4, 2018

(65) Prior Publication Data
US 2019/0172892 A1 Jun. 6, 2019

(30) Foreign Application Priority Data

Dec. 5, 2017 (KR) .......................... 10-2017-0166059

(51) Int. Cl.
*H01L 51/52* (2006.01)
*H01L 27/32* (2006.01)
*H01L 51/56* (2006.01)
*H01L 41/04* (2006.01)
(Continued)

(52) U.S. Cl.
CPC ...... *H01L 27/3276* (2013.01); *H01L 27/3244* (2013.01); *H01L 51/5215* (2013.01); *H01L 51/5234* (2013.01); *H01L 51/5275* (2013.01); *H01L 51/56* (2013.01);
(Continued)

(58) Field of Classification Search
None
See application file for complete search history.

(56) References Cited

U.S. PATENT DOCUMENTS 9,530,826 B2 12/2016 Kwon et al.
2005/0263755 A1 12/2005 Kang et al.
(Continued)

FOREIGN PATENT DOCUMENTS

CN 103794628 A 5/2014
CN 103872257 A 6/2014

OTHER PUBLICATIONS

Chinese Office Action dated Nov. 3, 2020, issued in corresponding Chinese Patent Application No. 201811482984.6.

*Primary Examiner* — Nicholas J Tobergte
*Assistant Examiner* — Kien C Ly
(74) *Attorney, Agent, or Firm* — Morgan, Lewis & Bockius LLP (57) ABSTRACT

A flexible OLED panel for a lighting device according to the present invention includes a substrate which is made of a polymer material and has a first light extracting pattern provided on a lower surface thereof; an auxiliary wiring pattern which is arranged on the substrate; a first electrode which is arranged on the substrate on which the auxiliary wiring pattern is arranged; a passivation layer which is arranged on the first electrode, at least on an area on which the auxiliary wiring pattern is arranged; an OLED light emitting structure which is arranged on the first electrode on which the passivation layer is arranged; a second electrode which is arranged on the OLED light emitting structure; and an encapsulation layer which is arranged on the second electrode.

4 Claims, 6 Drawing Sheets

(51) Int. Cl.
*H01L 41/09* (2006.01)
*H01L 51/00* (2006.01)

(52) U.S. Cl.
CPC .... *H01L 51/0097* (2013.01); *H01L 2225/107* (2013.01); *H01L 2227/323* (2013.01); *H01L 2251/5338* (2013.01)

(56) References Cited

U.S. PATENT DOCUMENTS

| | | | |
|---|---|---|---|
| 2012/0205709 A1* | 8/2012 | Yamazaki | H01L 51/5088 257/99 |
| 2013/0334506 A1* | 12/2013 | Tobise | H01L 51/5212 257/40 |
| 2014/0167006 A1 | 6/2014 | Kim | |
| 2015/0340658 A1* | 11/2015 | Higashika | H01L 51/52 257/40 |
| 2018/0083206 A1* | 3/2018 | Kurihara | H01L 51/0067 |

* cited by examiner

FLEXIBLE OLED PANEL FOR LIGHTING DEVICE AND METHOD OF MANUFACTURING SAME

CROSS-REFERENCE TO RELATED APPLICATION

This application claims the benefit of Korean Patent Application No. 10-2017-0166059, filed on Dec. 5, 2017, in the Korean Intellectual Property Office, the disclosure of which is incorporated herein in its entirety by reference.

BACKGROUND

1. Technical Field

The present invention relates to a light emitting panel for a lighting device and, more specifically, to a flexible OLED panel for a lighting device.

Also, the present invention relates to a method of manufacturing a flexible OLED panel for a lighting device.

2. Discussion of the Related Art

Currently, a fluorescent lamp or an incandescent lamp is mainly used as a lighting device. As for the incandescent light, a color rendering index is very preferable. However, energy efficiency is very low. As for the fluorescent lamp, although the energy efficiency is preferable, the lamp has a poor color rendering index and contains mercury, which is harmful for environment.

Recently, a lighting device based on a light emitting diode (LED) has been proposed. The light emitting diode is formed in a stacked configuration of a nitride semiconductor such as GaN and has the most preferable light emitting efficiency in a blue wavelength band, while the light emitting efficiency decreases in a red wavelength band is the lowest in a green wavelength band having the highest spectral luminous efficacy. Therefore, there is a problem that the light emitting efficiency is degraded when white light is emitted by combining a red light emitting diode, a green light emitting diode, and a blue light emitting diode altogether. Also, when the red light emitting diode, the green light emitting diode, and the blue light emitting diode are used, a color rendering property is also degraded since the diodes have narrow light emitting peaks, respectively.

In order to solve this problem, there is proposed a lighting device which outputs white light by combining the blue light emitting diode with a yellow fluorescent body, instead of combining the red light emitting diode, the green light emitting diode, and blue light emitting diode with one another. This type of light emitting diode is proposed since it is more efficient to use only the blue light emitting diode with high light emitting efficiency and realize the rest color by using a fluorescent substance, which receives blue light and emits yellow light, than to use the green light emitting diode with low light emitting efficiency.

However, even in the case of the lighting device which emits white light by combining the blue light emitting diode with a yellow fluorescent body, the fluorescent substance emitting yellow light itself has low light emitting efficiency. Therefore, it is not possible to improve the light emitting efficiency of the lighting device over a certain range.

In particular, in case of the lighting device based on a nitride semiconductor light emitting diode (LED), a heat radiation means should be arranged on a rear surface of the lighting device due to the heat generated at the light emitting diode. Furthermore, an expensive sapphire substrate should be used to obtain high-quality nitride semiconductor growth.

Also, as for the lighting device based on the light emitting diode, many processes, including an epitaxial process for growing a nitride semiconductor, a chip process for manufacturing respective light emitting diode chips, and an implementation process for implementing respective light emitting diode chips on a circuit substrate, are required.

In addition, as for the light emitting diode, the processes are performed on a rigid substrate such as a sapphire substrate. However, the flexible property cannot be obtained unless the respective light emitting diode chips are implemented on a soft substrate.

SUMMARY

Accordingly, embodiments of the present disclosure are directed to a flexible organic light emitting diode (OLED) panel for a lighting device and a method of manufacturing the same that substantially obviate one or more of the problems due to limitations and disadvantages of the related art.

An aspect of the present disclosure is to provide a flexible organic light emitting diode (OLED) panel for a lighting device.

Another aspect of the present disclosure is to provide a method of manufacturing a flexible OLED panel for a lighting device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flexible OLED panel for a lighting device according to an embodiment for solving the aforementioned problems comprises a substrate, an auxiliary wiring pattern, a first electrode, a passivation layer, an OLED light emitting structure, a second electrode, and an encapsulation layer.

The substrate includes a first light extracting pattern provided on a lower surface thereof. Also, in order to obtain the flexible property, the substrate is made of a polymer material such as polyimide and poly(ethylene naphthalate). The auxiliary wiring pattern is arranged on the substrate. The first electrode is arranged on the substrate on which the auxiliary wiring pattern is arranged. The passivation layer is arranged on the first electrode, at least on an area on which the auxiliary wiring pattern is arranged. The OLED light emitting structure is arranged on the first electrode on which the passivation layer is arranged. The second electrode is arranged on the OLED light emitting structure. The encapsulation layer is arranged on the second electrode.

The flexible OLED film for a lighting device according to the present invention with the configuration as above can have a flexible property since it includes a substrate made of a polymer material. Also, the light extracting efficiency can be improved since a light extracting pattern is arranged under the substrate.

The substrate can have a barrier layer on an upper surface thereof. The barrier layer can be made of an inorganic material such as $SiO_2$, $SiN_x$ etc., and prevent reaction between the substrate and the auxiliary wiring pattern and between the substrate and the first electrode. Therefore, the barrier layer can be used as an etch stop layer when the auxiliary wiring pattern is formed.

Also, a second light extracting pattern can be provided between the substrate and the barrier layer. The second light extracting pattern can serve to improve the light extracting efficiency by cooperating with the first light extracting pattern which is arranged under the substrate.

In addition, it is more preferred that the substrate is made of a poly(ethylene naphthalate) material. Since the poly(ethylene naphthalate) material has a high refractive property, it is possible to improve the light extracting efficiency without the second light extracting pattern.

In addition, the auxiliary wiring pattern can be made of a metal material, and the first electrode can be made of a transparent conductive oxide material. It is preferred that the first electrode is made of a transparent conductive oxide material in order to extract light downwards, and the auxiliary wiring pattern can compensate for the high resistance of the transparent conductive oxide, which allows a uniform voltage to be applied on an overall area of the first electrode.

Also, an opening through which the substrate (or a barrier layer where the barrier layer is provided on the substrate) is exposed can be arranged in the first electrode, and it can also be possible that the passivation layer is additionally arranged on the opening. Since the passivation layer is additionally arranged on the opening, permeation of moisture, air, etc. into the OLED light emitting structure can be suppressed more effectively.

A method of manufacturing a flexible OLED panel for a lighting device according to an embodiment of the invention for solving the aforementioned problems comprises: providing a substrate which is made of a polymer material and has a first light extracting pattern provided on a lower surface thereof; attaching the lower surface of the substrate to an auxiliary substrate on which an adhesive layer is arranged; arranging an auxiliary wiring pattern on the substrate; arranging a first electrode on the substrate on which the auxiliary wiring pattern is arranged; arranging a passivation layer on the first electrode, at least on an area on which the auxiliary wiring pattern is arranged; arranging an OLED light emitting structure on the first electrode on which the passivation layer is arranged; arranging a second electrode on the OLED light emitting structure; arranging an encapsulation layer on the second electrode; and detaching the auxiliary substrate.

By adopting the method of manufacturing a flexible OLED panel according to the present invention, an OLED panel with a flexible property can be manufactured by forming OLED light emitting structures and various electrode elements on a substrate made of a polymer material. Also, light extracting efficiency can be improved by forming a light extracting pattern under the substrate.

The method can further include forming a barrier layer on the upper surface of the substrate. By forming the barrier layer, reaction of the auxiliary wiring pattern and the first electrode with the substrate can be suppressed while forming the auxiliary wiring pattern and the first electrode. In addition, the barrier layer can be used as an etch stop layer for the auxiliary wiring pattern.

Also, after the second light extracting pattern is arranged on the upper surface of the substrate, a barrier layer can be formed on the substrate on which the second light extracting pattern is arranged. By arranging the second light extracting pattern in addition to the first light extracting pattern, the light extracting efficiency can be further improved.

Also, the substrate is preferably made of a poly(ethylene naphthalate) material. The poly(ethylene naphthalate) is a high refractive substance and can improve the light extracting efficiency along with the first light extracting pattern even when the second light extracting pattern is not arranged.

Meanwhile, the first electrode can be made of a transparent conductive oxide material and the method can further include arranging a non-crystallized transparent conductive oxide on the auxiliary wiring pattern; and crystallizing the transparent conductive oxide by irradiating the transparent conductive oxide with laser. Although the material for the lower portion of the substrate is conventionally restricted to a heat resistant polymer material such as polyimide in crystallizing the transparent conductive oxide using heat, the material is not restricted to the heat resistant polymer material for crystallizing the transparent conductive oxide using laser, and, therefore, a polymer material with a weak heat resistant property such as poly(ethylene naphthalate), etc. can also be used.

In addition, an opening can be formed in the first electrode such that the substrate is exposed, and the passivation layer can be additionally arranged on the opening. By doing so, it is possible to prevent degradation of light emitting property of the OLED light emitting structure due to permeation of moisture or air, and prevent a short-circuit between the first electrode and the second electrode.

Also, the auxiliary substrate can be detached from the substrate using a jig. Although the auxiliary substrate can be detached from the substrate by forming a sacrificial layer on the auxiliary substrate and peeling off the sacrificial layer using laser, a dark spot can occur due to ripping of the sacrificial layer and blurring can happen due to remaining sacrificial layers. In contrast to this, when the jig is used, the substrate and an adhesive layer can be removed from each other easily due to a weak adhesive force between them when adhesive forces between a lower jig and the auxiliary substrate and between an upper jig and the encapsulation layer are greater than that between the substrate and the adhesive layer.

The flexible OLED panel for a lighting device according to the present invention can be easily manufactured in a large size, which realizes surface emission, and an expensive sapphire substrate is not needed to form a nitride semiconductor light emitting diode. Also, heat emission is decreased compared to the nitride semiconductor light emitting diode. And, the flexible OLED film for a lighting device according to the present invention can have a flexible property since it uses a polymer substrate.

In addition, in the flexible OLED panel for a lighting device according to the present invention, external light extracting efficiency can be improved by the first light extracting pattern provided on the substrate.

Also, according to the method of manufacturing an OLED panel for a lighting device according to the present invention, the substrate made of a polymer material on which the first light extracting pattern is provided can be attached to the auxiliary substrate using an adhesive layer, and the substrate can be easily removed from the auxiliary substrate by using a jig.

In addition, substrates made of various materials can be used in the method of manufacturing an OLED panel for a lighting device the transparent conductive oxide is crystallized by using laser.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

In the following, embodiments of a flexible OLED panel for a lighting device and a manufacturing method thereof according to the present invention are described by referring to the figures.

Although the terms representing an ordinal number such as first, second, etc. can be used to explain various components in the following, the components are not to be limited by these terms. These terms are used only for the purpose of discriminating one component from other components.

Also, phrases "A is on B" not only refers to the case when A is directly on B while contacting B but also to the case "A is on B while A is not contacting B or C is interposed between A and B".

Figure 1:
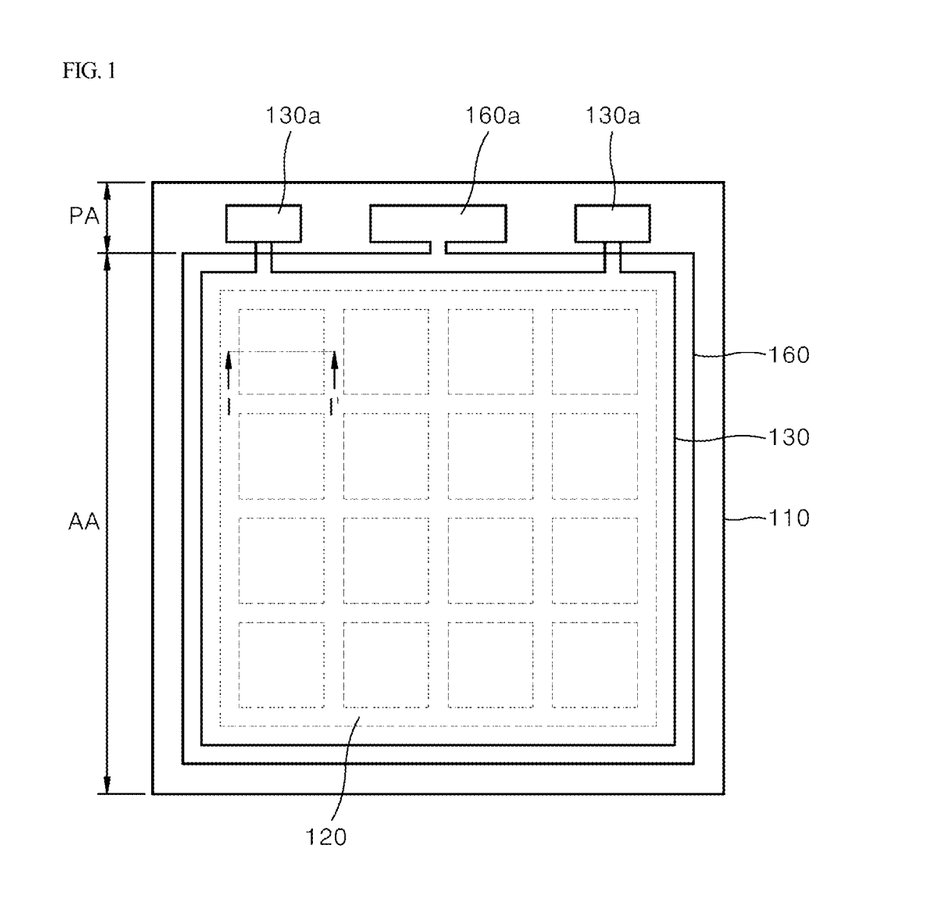
FIG. 1 schematically shows a plan view of a flexible OLED panel for a lighting device according to the present invention.

FIG. 1 schematically shows a plan view of a flexible OLED panel for a lighting device according to the present invention. Also, FIG. 2 illustrates an example of an I-I' section of FIG. 1.

Figure 2:
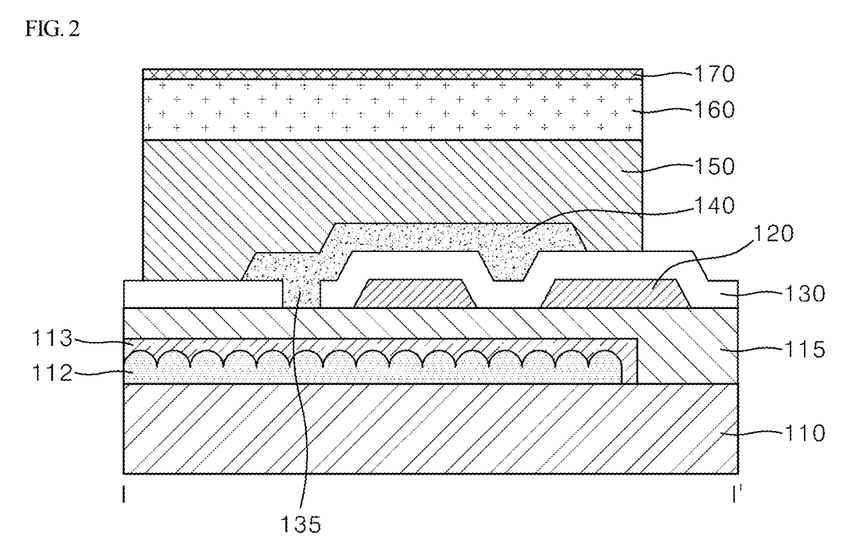
FIG. 2 illustrates an example of an I-I' section of FIG. 1.

When referring to FIGS. 1 and 2, the flexible OLED panel for a lighting device according to the present invention includes a substrate 110, an auxiliary wiring pattern 120, a first electrode 130, a passivation layer 140, an OLED light emitting structure 150, a second electrode 160, and an encapsulation layer 170.

A polymer material such as polyimide (PI), poly(ethylene naphthalate) (PEN), poly(ethylene terephthalate) (PET) can be used for the substrate 110 such that the substrate can have a flexible property. Since the substrate 110 is made of a polymer material, the flexible OLED panel for a lighting device can be manufactured by a roll-to-roll process.

Here, substrate 110 is preferably made of a poly(ethylene naphthalate) material. When the PEN is used, high light extracting efficiency can be obtained without a second light extracting pattern 112 since the PEN has a higher refractive property than polyimide.

A barrier layer 115 can be provided on an upper surface of the substrate 110. The barrier layer 115 can be made of an inorganic material such as SiO2, SiN$_x$, etc. and can prevent the reactions between the substrate 110 and the auxiliary wiring pattern 120 and between the substrate 110 and the first electrode 130. Also, the barrier layer 115 can be used as an etch stop layer when the auxiliary wiring pattern 120 is formed.

And, a light extracting pattern 112 (in the following, it is referred to as a second light extracting in order to be distinguished from a first light extracting pattern 111 of FIG. 3) can be provided between the substrate 110 and the barrier layer 115. The second light extracting pattern 112 can be formed in a film 113. Alternatively the second light extracting pattern 112 can be an inkjet printed layer. High refractive light scattering particles such as $TiO_2$, $BaTiO_3$, $ZrO_2$, ZnO, $SiO_2$, etc. can be included in the light extracting pattern 112.

The second light extracting pattern 112 can serve to improve the light extracting efficiency by cooperating with the first light extracting pattern 111 which is arranged at the lower portion of the substrate 110. Of course, when the substrate 110 is made of a poly(ethylene naphthalate) material having a high refractive index, the second light extracting pattern can be omitted since the material has high light extracting efficiency by itself.

Meanwhile, when referring to FIG. 1, the substrate 110 can be divided into an array area AA and a pad area PA. The array area AA can also be divided into a light emitting area and a wiring area. The light emitting area can be an area where first electrode (for example, an anode electrode) is arranged under the OLED light emitting structure 150 and a second electrode (for example, a cathode electrode) is arranged on the OLED light emitting structure 150.

The auxiliary wiring pattern 120 is arranged on the substrate 110. The role of the auxiliary wiring pattern 120 can be illustrated as follows. The first electrode 130 can be generally formed with a transparent conductive oxide (TCO) material such as indium tin oxide (ITO), fluorine-doped tin oxide (FTO), etc., and the transparent conductive oxide material has a resistance much higher than metal while it can transmit the light emitted from the OLED light emitting structure 150. Therefore, when a large OLED panel for a lighting device is manufactured, the applied voltage is not distributed uniformly over the first electrode overall due to the high resistance of the transparent conductive oxide, which results in degradation of brightness uniformity of a large-sized lighting device.

Therefore, the auxiliary wiring pattern 120 is made of a material having a resistance lower than that of the transparent conductive oxide such as, e.g., Cu, Al, etc., such that the voltage applied on the first electrode 130 contacting the auxiliary wiring pattern 120 is uniformly distributed across the first electrode 130.

Meanwhile, although the auxiliary wiring pattern 120 can be formed as a net as shown in FIG. 1, the auxiliary wiring pattern is not restricted to this. Also, although the auxiliary wiring pattern 120 can be formed to be close to bilateral symmetry, the auxiliary wiring pattern is not restricted to this.

Meanwhile, when referring to FIG. 2, the auxiliary wiring pattern 120 can have a tapered cross-section whose width gets narrower close to an upper part. By adopting this configuration, the first electrode 130, etc. can be stably arranged on the auxiliary wiring pattern 120.

The first electrode 130 is arranged on the substrate 110 on which the auxiliary wiring pattern 120 is arranged. As shown in the example of FIG. 1, the first electrode 130 is connected to a first electrode pad 130a The first electrode 130 can be formed of a transparent conductive oxide material such as ITO and by using a sputtering process or a coating process.

Here, the auxiliary wiring pattern 120 can be made of a metal material, and the first electrode 130 can be made of a transparent conductive oxide material. It is preferred that the first electrode 130 is made of a transparent conductive oxide material in order to extract light downwards, and the auxiliary wiring pattern 120 compensates for the high resistance of the transparent conductive oxide, which allows a uniform voltage to be applied on an overall area of the first electrode 130.

The passivation layer 140 is arranged on the first electrode 130, at least on an area on which the auxiliary wiring pattern 120 is arranged.

When a short-circuit occurs between the first electrode 130 and the second electrode 160 in the OLED lighting device, brightness is degraded not only on the portion where the short-circuit occurs but also on the overall panel due to a current drop phenomenon. In order to prevent this, the passivation layer 140 is formed at least on the auxiliary wiring pattern 120.

The passivation layer 140 can be formed of an organic material such as polyimide group substances, and can also be formed of an inorganic material such as alumina ($Al_2O_3$), silicon nitride ($SiN_x$), etc. More specifically, the passivation material can be an organic material such as polyimide, etc. as well as an inorganic material such as alumina, silicon nitride, etc. The passivation material can be deposited by using an atom layer deposition (ALD) method, a chemical vapor deposition (CVD) method, etc.

Also, as shown in the example in FIG. 2, an opening 135 through which the substrate 110 is exposed can be arranged in the first electrode. Here, when a barrier layer is provided on the substrate 110, the barrier layer 115 can be exposed through the opening 135. The passivation layer 140 can be additionally arranged on the opening 135. Since the passivation layer 140 is additionally arranged on the opening 135, permeation of moisture, air, etc. into the OLED light emitting structure can be suppressed more effectively.

The OLED light emitting structure 150 is arranged on the first electrode 130 on which the passivation layer 140 is arranged.

In the OLED light emitting structure 150, an organic light emitting layer (emission layer; EML), a hole injection layer (HIL) and/or a hole transport layer (HTL) for providing holes into the organic light emitting layer, and an electronic transport layer (ETL) and/or an electronic injection layer (EIL) for providing electrons to the organic light emitting layer can be included.

The layers of the OLED light emitting structure 150 can be formed by depositing an organic material such as, e.g., copper phthalocyanine (CuPc), N, N'-Di(naphthalene-1-yl)-N, N'-diphenylbenzidine) (NPB), aluminum(tris-8-hydroxyquinoline aluminum) (Alq3), etc. by a vacuum deposition method.

The second electrode 160 is arranged on the OLED light emitting structure 150. The second electrode 160 is arranged on the OLED light emitting structure 150 and is arranged to be connected to a second electrode pad 160a as shown in FIG. 1. The second electrode 160 is made of a transparent conductive oxide material such as ITO or a metal material.

The encapsulation layer 170 is arranged on the second electrode 160 and prevents moisture or air from permeating from outside. The encapsulation layer 170 can be formed of an organic material such as an acrylate compound and an epoxy compound, an inorganic material such as a ceramic and a metal, or an organic/inorganic composite, and it can be formed in a single-layer structure or a multi-layered structure.

Although the example in FIG. 2 shows the encapsulation layer 170 formed only on the second electrode 160, the encapsulation layer 170 can also be formed on a side surface, etc. of the OLED light emitting structure 150 in order to improve a permeation prevention effect against moisture, etc.

A barrier film and a protective film can be additionally formed on the encapsulation layer 170 by way of an adhesive layer, and the barrier film and the protective film can also prevent moisture or air from permeating from outside. The protective film can be a PET substrate, a metal foil, etc.

Meanwhile, when referring to FIG. 1, first electrode pad 130a is connected to the first electrode 130. And, the second electrode pad 160a is connected to the second electrode 160. Although the second electrode pad 160a is arranged at the center of the pad area and the first electrode pads 130a are arranged at both sides of the second electrode pad 160a in the example of FIG. 1, the arrangement, size, number, etc. of the electrode pads can be varied when needed.

The first electrode pad 130a can include a lower layer made of the same material as the auxiliary wiring pattern 120 and an upper layer made of the same material as the first electrode 130. The lower layer and the auxiliary wiring pattern 120 can be formed at the same time, and the lower layer can be connected directly with the auxiliary wiring pattern 120. The upper layer and the first electrode 130 can be formed at the same time. When the lower layer is connected directly with the auxiliary wiring pattern 120, the upper layer does not necessarily be connected with the first electrode 130.

The second electrode pad 160a can include a lower layer made of the same material as the auxiliary wiring pattern 120 and an upper layer made of the same material as the second electrode 160. The lower layer and the auxiliary wiring pattern 120 can be formed at the same time and the upper layer and the second electrode 160 can be formed at the same time.

Figure 3:
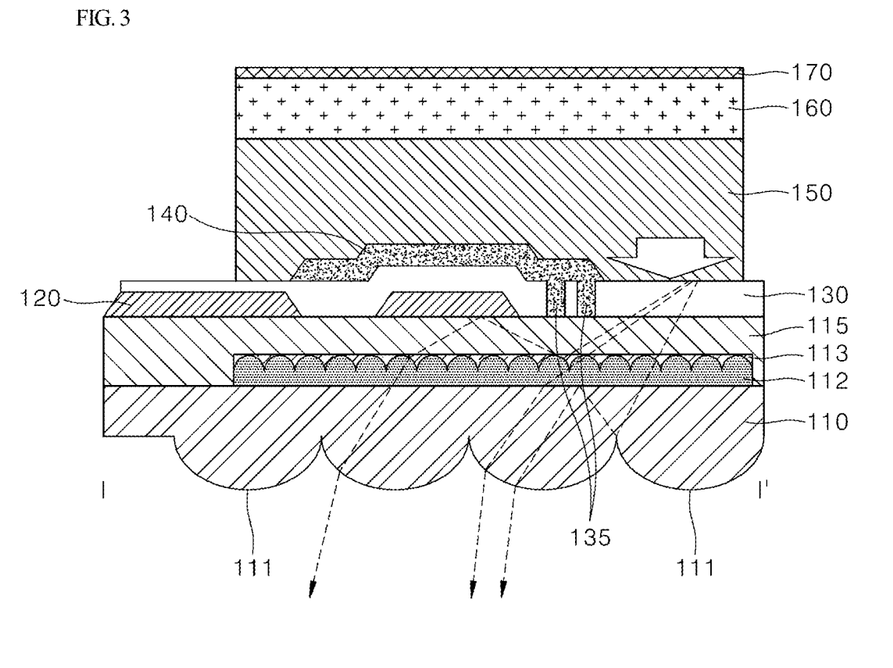
FIG. 3 illustrates an example of an I-I' section of FIG. 1 according to a preferred embodiment of the present invention.

FIG. 3 illustrates an example of an I-I' section of FIG. 1 according to a preferred embodiment of the present invention.

Referring to FIG. 3, the example in FIG. 3 has a configuration similar to that in FIG. 2, or a first light extracting pattern 111 is provided on the lower surface of the substrate 110.

As in the case of the second light extracting pattern 112, the first light extracting pattern 111 can be a microlens pattern and improves the light extracting efficiency. Also, as shown in the following FIG. 4A, the first light extracting pattern 111 can be formed when the substrate 110 is manufactured.

In the following, the method of manufacturing a flexible OLED panel for a lighting device according to embodiments of the present invention will be described by referring to FIGS. 4A to 4E.

Figure 4A:
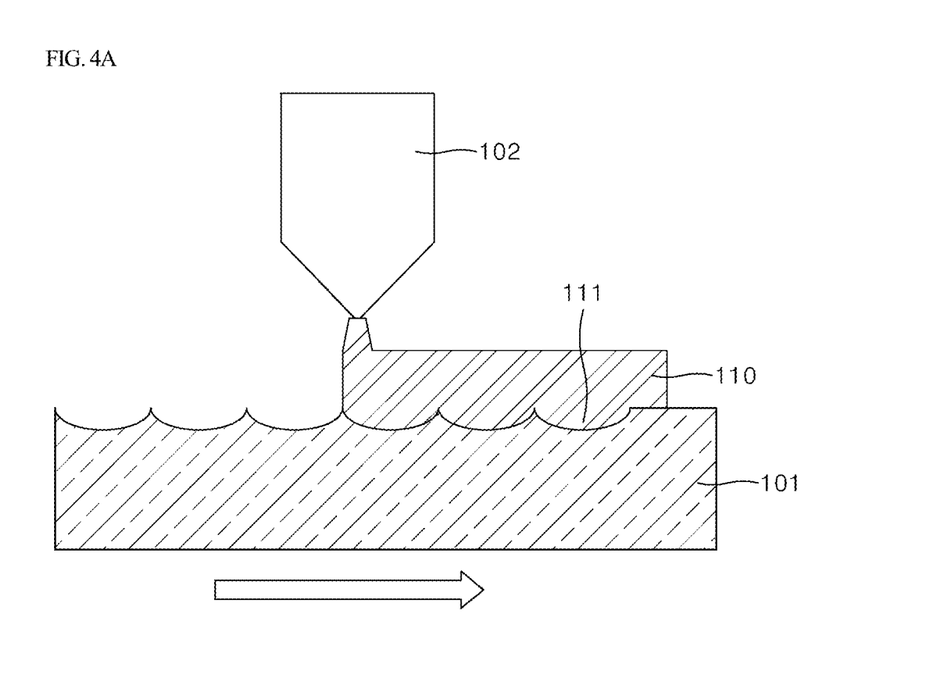
FIGS. 4A to 4E illustrate a method of manufacturing a flexible OLED panel for a lighting device according to embodiments of the present invention.

At first, as shown in the example in FIG. 4A, a substrate 110, which is made of a polymer material and has a polymer material provided on a lower surface thereof, is provided. The substrate 110 made of a polymer material and having the first light extracting pattern 111 provided on the lower surface can be manufactured by applying a liquid polymer on a sheet or drum-like templet on which a pattern opposite to the first light extracting pattern is formed using a compression nozzle, and then curing the polymer.

Meanwhile, it can be considered that the substrate 110 is coated on the auxiliary substrate. However, by using this method, a fault can occur due to a foreign matter and a separate curing time is required after coating. Therefore, it is more preferable to manufacture the substrate 110 in advance and then the auxiliary substrate 103 is attached to the substrate by using an adhesive layer 104.

Figure 4B:
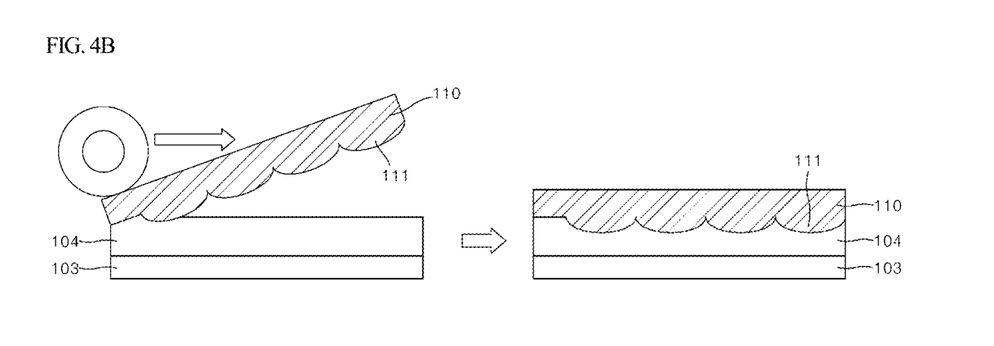

Next, as shown in FIG. 4B, the lower surface (the surface on which the first light extracting pattern is formed) of the substrate 110 is attached to the auxiliary substrate 103 on which the adhesive layer 104 is arranged.

When the substrate 110 is made of a polymer material, it has a small thickness. Therefore, the auxiliary substrate 103 is attached to the substrate to improve strength before subsequent processes are performed. The auxiliary substrate 103 can be a glass substrate and can also be a substrate made of a polymer material which is thicker than the substrate 110.

The adhesive layer 104 can be an adhesive film. When the substrate made of a polymer material is arranged on and pressed against the adhesive layer 104, the shape of the adhesive layer 104 is changed to correspond to that of the first light extracting pattern 111 and the substrate made of a polymer material is attached to the adhesive layer as shown in FIG. 4B.

Figure 4C:
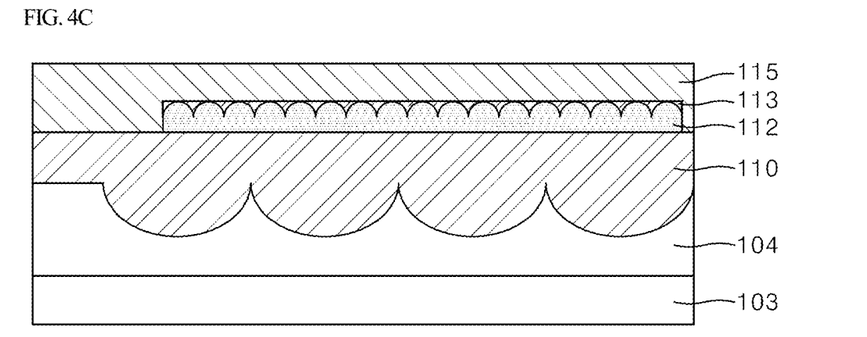

Then, as shown in FIG. 4C, a barrier layer 115 can be further formed on the substrate 110 which is supported by the auxiliary substrate 103 via the adhesive layer 104.

Also, a second light extracting pattern 112 can be formed on the substrate 110 before the barrier layer 115 is formed. The second light extracting pattern 112 can be provided in the film 113 (see FIG. 3) Alternatively the second light extracting pattern 112 can be formed by inkjet printing. Here, when the substrate 110 is made of poly(ethylene naphthalate), the separate second light extracting pattern 112 can be omitted since the poly(ethylene naphthalate) has a high refractive index.

By forming the barrier layer 115, reaction of the auxiliary wiring pattern 120 and the first electrode 130 with the substrate 110 can be suppressed while forming the auxiliary wiring pattern and the first electrode as follows. Also, the barrier layer 115 can be used as an etch stop layer during an etching process for forming the auxiliary wiring pattern 120.

Figure 4D:
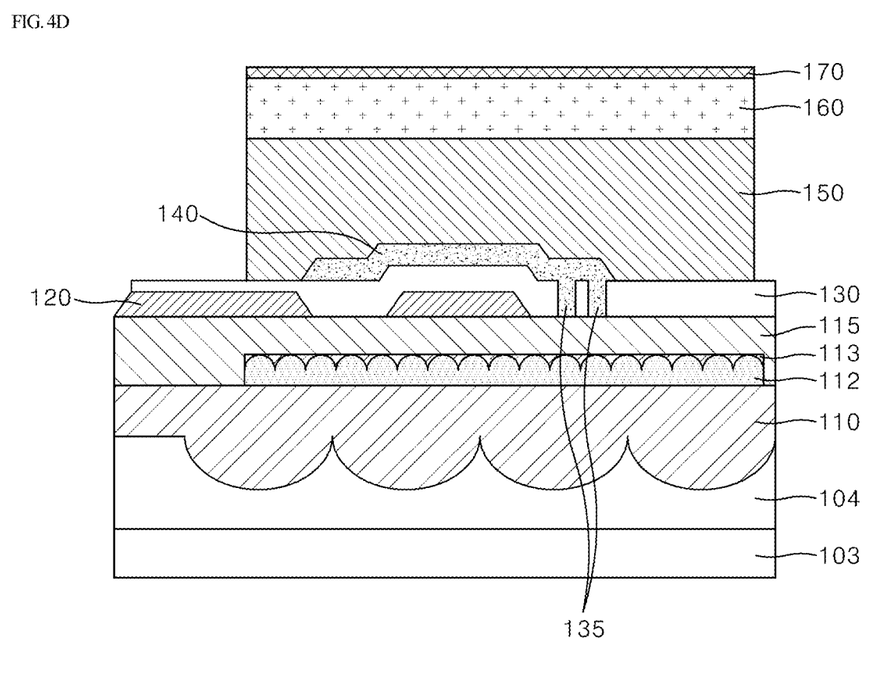

Then, as shown in FIG. 4D, the auxiliary wiring pattern 120, the first electrode 130, the passivation layer 140, the OLED light emitting structure 150, the second electrode 160, and the encapsulation layer 170 are sequentially formed on the substrate 110 (or the barrier layer 115 when the barrier layer 115 is formed).

More specifically, as for the example shown in FIG. 4D, the auxiliary wiring pattern 120 is arranged on the barrier layer 115. Then, the first electrode 130 is arranged on the barrier layer 115 on which the auxiliary wiring pattern 120 is arranged. The example of forming the first electrode 130 will be explained by referring to FIGS. 5A to 5C. Then, the passivation layer 140 is arranged on an area of the first electrode over the auxiliary wiring pattern 120. Then, the OLED light emitting structure 150 is arranged on the first electrode 130 on which the passivation layer 140 is arranged.

Then, the second electrode 160 is arranged on the OLED light emitting structure 150. Here, after the second electrode 160 is formed, an aging voltage is applied on the OLED light emitting structure 150 to perform aging on the OLED light emitting structure 150 when needed. The organic light emitting material has a short lifetime, is prone to moisture or oxygen, and the material can be damaged when a high voltage or a high current is applied. Also, device characteristics are unstable due to poor interface characteristics between the first and second electrodes 130, 160 and the OLED light emitting structure 150. In addition, impurities can be stacked in the OLED light emitting structure 150 while the second electrode 160 is formed, which results in degradation of light emitting properties and color properties of the organic material. In order to solve these problems, a high-voltage aging voltage can be applied on the OLED light emitting structure 150 such that the OLED light emitting structure 150 is aged in a short period of time. Here, the aging voltage can be a high voltage higher than the voltage which is applied on the first electrode 130 and the second electrode 160. As an alternative example, the aging voltage can be a reverse voltage with respect to the voltage applied on the first electrode 130 and the second electrode 160.

Then, the encapsulation layer 170 is arranged on the second electrode 160. The encapsulation layer 170 can be formed of an organic material such as an acrylate compound, etc., an inorganic material such as a ceramic and a metal, or an organic/inorganic composite. Also, the protective film, barrier film, etc. can be additionally formed on the encapsulation layer 170 when needed.

Figure 4E:
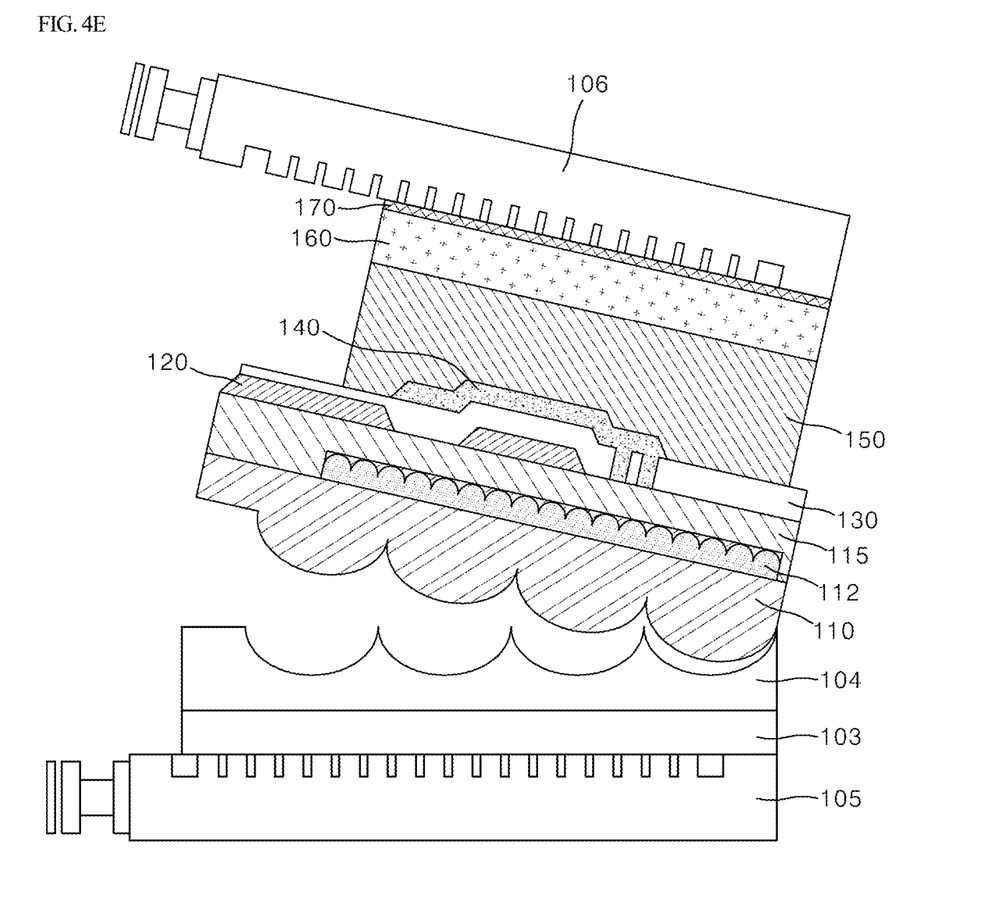

Then, as shown in the example in FIG. 4E, the auxiliary substrate 103 is attached to and removed from the substrate. When the adhesive layer 104 is attached to and removed from the substrate 110, the auxiliary substrate 103 is readily attached to and removed from the substrate.

The attachment and removal of the auxiliary substrate 103 can be performed by using a jig including a lower jig 105 and an upper jig 106 as shown in the example in FIG. 4E. Of course, it is possible to form a sacrificial layer on the auxiliary substrate 103 and peel off the sacrificial layer by using a laser lift-off method in order to attach and remove the auxiliary substrate. On the other hand, when the laser lift-off method is adopted, a dark spot can occur due to ripping of the sacrificial layer and blurring can occur due to remaining sacrificial layers. In contrast to this, when the jig 105, 106 is used, the substrate 110 and the adhesive layer 104 can be removed from each other easily due to a weak adhesive force between them when adhesive forces between the lower jig 105 and the auxiliary substrate 103 and between the upper jig 106 and the encapsulation layer 170 are greater than that between the target substrate 110 and the adhesive layer 104.

Figure 5A:
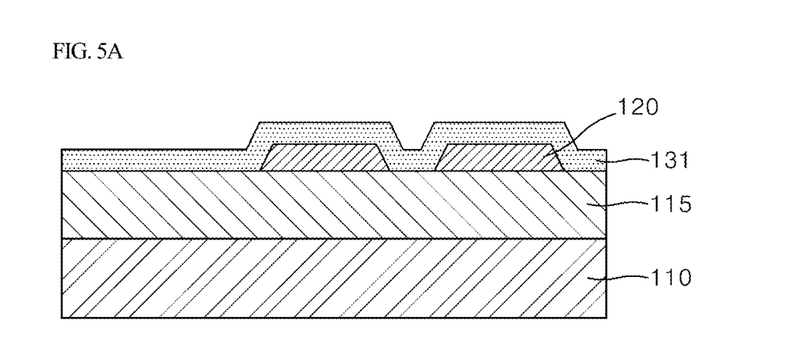
FIGS. 5A to 5C schematically illustrate a first electrode forming process using laser.
Figure 5B:
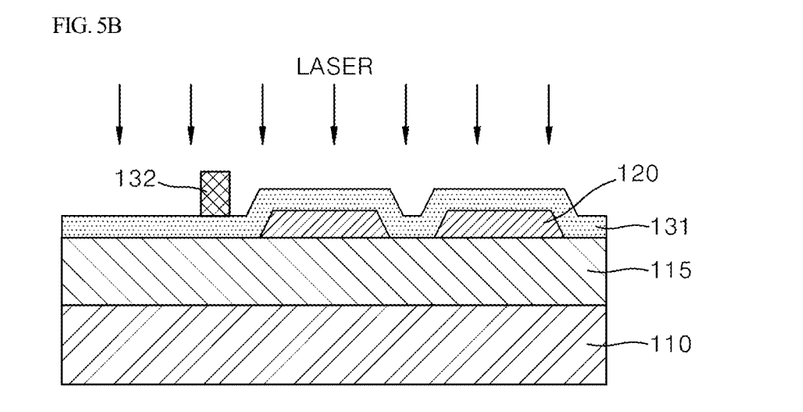
Figure 5C:
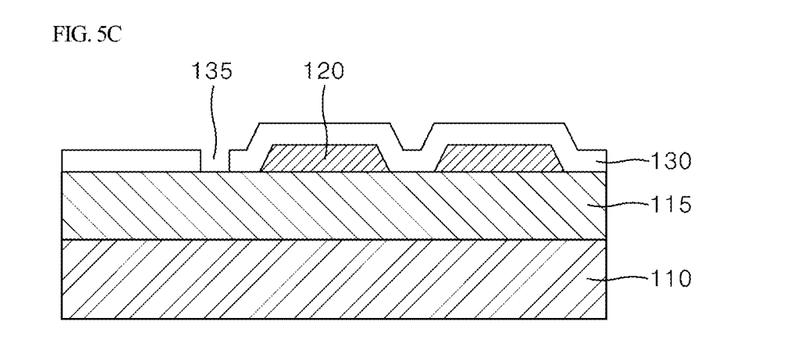

FIGS. 5A to 5C schematically illustrate a first electrode forming process using laser.

As described above, the first electrode 130 of the flexible OLED panel for a lighting device according to the present invention can be made of a transparent conductive oxide material and the first electrode 130 can be formed as follows.

At first, as shown in the example in FIG. 5A, a non-crystallized transparent conductive oxide 131 is arranged on the barrier layer 115 on which the auxiliary wiring pattern 120 is arranged by sputtering, etc. Then, as shown in the example in FIG. 5B, the oxide is irradiated with laser such that the non-crystallized transparent conductive oxide 131 is crystallized. By crystallizing the oxide, the resistance of the transparent conductive oxide can be decreased to be lower than half the resistance before crystallization, and optical transmittance can also be improved. There is no specific restriction on the laser used, and an excimer laser with short wavelength and high power characteristics can be used.

The crystallization of the transparent conductive oxide using this laser has the following advantages. As for the crystallization of the transparent conductive oxide in a conventional oven, the material for a lower part of the substrate is restricted to a heat resistant polymer material. On the other hand, in case of the crystallization of the transparent conductive oxide using laser as shown in the examples in FIGS. 5A and 5B, the material is not restricted to the heat resistant polymer material, and a polymer material with a weak heat resistant property such as poly(ethylene naphthalate), etc. can also be used.

When the poly(ethylene naphthalate) is used, it has a high refractive index and is known as a substrate material with a superb light extracting effect. However, heat resistance of the poly(ethylene naphthalate) is relatively low compared to polyimide. Therefore, when the transparent conductive oxide arranged on poly(ethylene naphthalate) is inserted into an oven at a temperature of about 230° C. to be crystallized, there is a problem that poly(ethylene naphthalate) is degraded. Therefore, the polymer substrate material which can be inserted into the oven at a temperature of about 230° C. has been restricted to polyimide with reasonable heat resistant properties. However, a separate element is required for improving light extraction since polyimide has a low light extracting effect. Also, polyimide is one of the most expensive elements in the polymer series flexible films.

On the other hand, when the transparent conductive oxide is crystallized by using laser as shown in the examples in FIG. 5A and FIG. 5B, even a substrate with a weak heat resistance can be used without affecting the substrate. Also, it is possible to apply heat only on the transparent conductive oxide locally such that the irradiated transparent conductive oxide is crystallized. As a result, poly(ethylene naphthalate) can be used and, therefore, the second light extracting pattern can be omitted.

Also, when the opening 135 is to be formed in a portion of the first electrode 130 as shown in the example in FIG. 5C, a laser heat treatment is performed while a mask 132 is arranged on a predetermined area, and a wet etching is then performed by using an etchant such as an oxalic acid, etc. in order to expose the barrier layer 115. The passivation layer is additionally arranged on the opening 135. By arranging the passivation layer on the opening 135, it is possible to prevent degradation of light emitting property of the OLED light emitting structure due to permeation of moisture or air, and prevent a short-circuit between the first electrode and the second electrode.

The method shown in FIGS. 5A to 5C can be performed in three steps such as a non-crystallized transparent conductive oxide deposition process, a laser crystallization process, and a wet etching process. Therefore, the process is simplified compared to the conventional method including a non-crystallized transparent conductive oxide deposition process, a photoresist coating process, an exposure process, a development process, a wet etching process, a stripping process, and an oven heat treatment process.

As explained in the above, by adopting the method of manufacturing the flexible OLED panel according to the present invention, an OLED panel with a flexible property can be manufactured by forming OLED light emitting structures and various electrode elements on a substrate made of a polymer material. Also, light extracting efficiency can be improved by forming a light extracting pattern at a lower portion of the substrate.

It will be apparent to those skilled in the art that various modifications and variations can be made in the flexible organic light emitting diode (OLED) panel for a lighting device and the method of manufacturing the same of the present disclosure without departing from the technical idea or scope of the disclosure. Thus, it is intended that the present disclosure cover the modifications and variations of this disclosure provided they come within the scope of the appended claims and their equivalents.

NUMERICAL SYMBOLS

110: substrate
115: barrier layer
120: auxiliary wiring pattern
130: first electrode
130a: first electrode pad
140: passivation layer
150: OLED light emitting structure
160: second electrode
160a second electrode pad
170: encapsulation layer

What is claimed is:
1. A flexible OLED panel for a lighting device, the panel comprising:
   a substrate made of a polymer material and having a first light extracting pattern provided on a lower surface thereof;
   an auxiliary wiring pattern disposed on the substrate;
   a first electrode disposed on the substrate on which the auxiliary wiring pattern is disposed;
   a passivation layer disposed on the first electrode, at least on an area on which the auxiliary wiring pattern is disposed;
   an OLED light emitting structure disposed on the first electrode on which the passivation layer is disposed;
   a second electrode disposed on the OLED light emitting structure; and
   an encapsulation layer disposed on the second electrode,
   wherein a barrier layer is provided on an upper surface of the substrate,
   wherein a second light extracting pattern is provided between the substrate and the barrier layer, and
   wherein the first light extracting pattern is a microlens pattern.
2. The flexible OLED panel for a lighting device of claim 1, wherein the substrate is made of a poly(ethylene naphthalate) material.
3. The flexible OLED panel for a lighting device of claim 1, wherein the auxiliary wiring pattern is made of a metal, and the first electrode is made of a transparent conductive oxide material.
4. The flexible OLED panel for a lighting device of claim 1, wherein an opening through which the substrate is exposed is arranged in the first electrode, and the passivation layer is additionally arranged on the opening.

* * * * *